United States Patent [19]

Kadota et al.

[11] Patent Number: 4,523,301
[45] Date of Patent: Jun. 11, 1985

[54] ASSOCIATIVE MEMORY

[75] Inventors: Hiroshi Kadota, Toyonaka; Eisuke Ichinohe, Katano, both of Japan

[73] Assignee: Matsushita Electric Industrial Co., Ltd., Osaka, Japan

[21] Appl. No.: 499,912

[22] Filed: Jun. 1, 1983

[30] Foreign Application Priority Data

Jun. 4, 1982 [JP] Japan .................................. 57-96405

[51] Int. Cl.$^3$ ............................................. G11C 11/40
[52] U.S. Cl. .................................... 365/49; 365/154; 365/190
[58] Field of Search ................. 365/49, 154, 190, 202, 365/203

[56] References Cited

U.S. PATENT DOCUMENTS 3,633,182  1/1972  Koo ........................................ 365/49
3,969,707  7/1976  Lane et al. .............................. 365/49

*Primary Examiner*—Joseph A. Popek
*Attorney, Agent, or Firm*—Stevens, Davis, Miller & Mosher

[57] ABSTRACT

An associative memory comprises memory cells arrayed in columns and rows, a pair of complementary bit lines disposed for each column of the memory cells, a word line disposed for each row of the memory cells, and a sense line disposed also for each row of the memory cells. Each memory cell includes a bistable circuit provided by a pair of cross-coupled inverters, a pair of first switching elements connected between the two nodal points of the bistable circuit and the bit lines respectively to be controlled depending on the potential of the word line, and a pair of second switching elements and a pair of diodes or like circuit elements having a rectifying characteristic connected in series between the bit lines and the sense line respectively. These second switching elements are controlled depending on the potentials of the two nodal points respectively in the bistable circuit. A load element, a sensing amplifier and a tri-state driver circuit are connected to the sense line. An input reference data bit pattern is applied in complementary fashion to the bit lines, and coincidence or non-coincidence between the input reference data and the stored data is discriminated by checking the output of the sensing amplifier connected to each sense line.

5 Claims, 12 Drawing Figures

ASSOCIATIVE MEMORY

This invention relates to the structure of an associative memory capable of high-speed operation.

An associative memory or content addressable memory (CAM) has a function contrary to that of a conventional memory in that a data (a data bit pattern corresponding to one word) is applied thereto to find out whether or not the same data is stored therein, and it generates an output indicative of the address of the data when the result of detection proves that the specific data is stored therein. Therefore, this CAM can be effectively used for the execution of data retrieval and sorting at a very high speed since such can be done directly by the hardware. The CAM known heretofore in the art has had a structure as, for example, shown in FIG. 1.

Referring to FIG. 1, the prior art CAM includes a conventional random access memory RAM including an address decoder AD and memory cells $M_0$. In response to the application of a start signal ST, a counter C starts its counting operation, and its binary output is applied by way of output lines $A_1$ to $A_m$ to the address decoder AD as an address signal. Suppose that the number of words that can be stored in the RAM (corresponding to the number of vertical stages in the case of FIG. 1) is $2^m$, then, the counter C counts a maximum of $2^m$. Therefore, the number of required output lines $A_i$ of the counter C is m. A reference data for the purpose of comparison is applied to input terminals $D_1'$ to $D_n'$ of a comparator E. A data stored in and read out from the RAM is applied to other input terminals $D_1$ to $D_n$ of the comparator E to be compared bitwise with the reference data, and, when all the bits of the RAM-stored data are proved to be entirely the same as those of the reference data respectively, an all-"1" output appears at output terminals $E_1$ to $E_n$ of the comparator E. The address of the specific data stored in the RAM (i, e., the counter output appearing at the output lines $A_1$ to $A_m$ at that time) is checked in this manner to realize the function as the CAM.

The prior art CAM shown in FIG. 1 has been defective in that a length of time corresponding to $2^m$ cycles is required for checking the coincidence between all of data stored in the RAM and a reference data. In the case of a high-speed CAM, one cycle is about 0.1 μsec, and the number m of address bits is more than 10. This means that a very large length of time corresponding to more than $2^{10}$ or more than 1,000 cycles is required, for checking the coincidence. Thus, even with the use of such a high-speed CAM, a length of time of more than about 100 μsec is required for each processing. This length of time is very long compared with the period of time (1 μsec to several-ten μsec) required for the execution of various operations (such as arithmetic operations) by, for example, high-speed arithmetic circuits, and such a very slow operation speed has been a bottleneck for the execution of programs.

With a view to obviate the defect of the CAM structure of FIG. 1 whose operation speed is very slow, a CAM structure as shown in FIGS. 2A and 2B has been proposed in which the integration density is greatly sacrificed compared with a conventional RAM or the like to attain the desired high-speed operation. FIG. 2A shows the circuit of the basic memory cell of the proposed CAM, and FIG. 2B shows the structure of the memory array using a plurality of memory cells as shown in FIG. 2A. In FIG. 2A, the structure of the upper half of the memory cell designated by $M_1$ is the same as that of the memory cell of a conventional static RAM in that a pair of switching elements $Q_0$ are connected to a bistable circuit composed of a pair of cross-coupled inverters. In FIG. 2A, the lower half designated by $M_2$ is added. The symbol c in FIG. 2A (symbols $c_1, c_2, \ldots, c_l$ in FIG. 2B) designates a word line applying an address signal, and the symbols a and b in FIG. 2A ($a_1, a_2, \ldots, a_n$; $b_1, b_2, \ldots, b_n$ in FIG. 2B) designate a bit line pair provided for the input and output of data. The memory shown in FIGS. 2A and 2B stores information by the same operation as a conventional static RAM. When, on the other hand, the memory is to be operated as an associative memory, reference data signals at complementary potentials are applied to the bit lines a and b respectively in FIG. 2A, and an exclusive—NOR output $DP_1 = M \cdot B + \overline{M} \cdot \overline{B}$ indicative of the exclusive—NOR of the reference data and the data stored in the memory cell appears at a nodal point $P_1$. (The symbol $DP_1$ designates the state at the nodal point $P_1$, M designates the state of the storage, B designates the state of the bit lines, and the overbar designates the negation of the state). Thus, a "1" appears at the nodal point $P_1$ when coincidence between the data bits is reached, while a "0" appears at $P_1$ when coincidence is not reached.

In order to detect coincidence or non-coincidence for one word composed of n bits in FIG. 2B, the exclusive-NOR outputs for the individual bits are propagated while sequentially making AND operations until finally the logical product of all the bits is obtained at the right-hand end of the memory array. If there is bit non-coincidence in any one of the memory cells disposed on the left-hand side of the memory cell shown in FIG. 2A, a "0" appears at a nodal point $P_2$, and the resultant AND output appearing at a nodal point $p_3$ is also a "0". In a conventional integrated circuit, it is difficult to provide an AND circuit by a single gate. Therefore, in FIG. 2A, a NAND gate and an inverter is connected in series to realize the AND circuit. This second prior art example of the CAM has the following drawbacks:

(1) The number of circuit elements constituting the basic memory cell is considerably large. In the case of, for example, an N-channel LSI, the conventional RAM part $M_1$ requires 6 elements, and the additional part $M_2$ requires 14 elements. Consequently, the memory capacity per unit area is degraded to $\frac{1}{3}$ or $\frac{1}{4}$ of the conventional value even with simple estimation.

(2) The exclusive-NOR output passes through the combination of an NAND gate and an inverter in each memory cell for the detection of coincidence or non-coincidence on all the bits of one word. Therefore, when one word is composed of 10 or more bits, the resultant propagation delay limits the speed of access.

Thus, in the case of the prior art CAM of LSI structure shown in FIGS. 2A and 2B, the memory capacity is quite small, and yet, the operation speed is not sufficiently high in spite of the small memory capacity.

It is therefore a primary object of the present invention to provide a novel and improved associative memory or CAM which is composed of memory cells substantially comparable with conventional RAM cells in size and yet which can operate at a speed sufficiently higher than that of a CAM such as that shown in FIGS. 2A and 2B.

The present invention will now be described in detail with reference to the accompanying drawings, in which.

Figure 3:
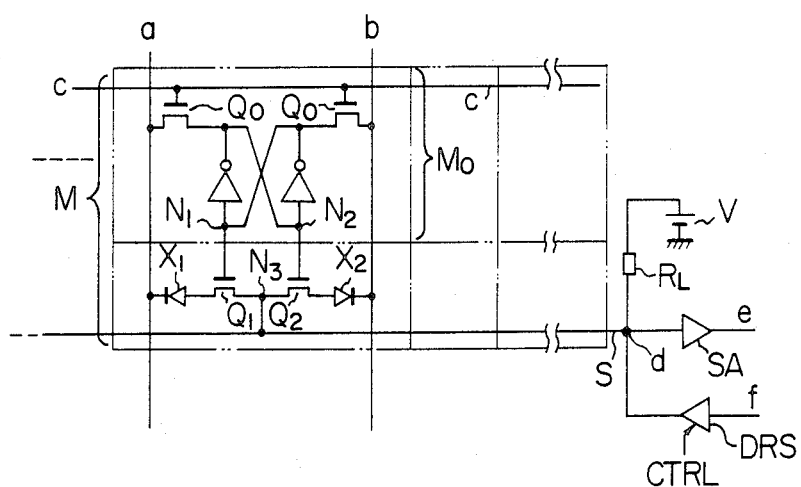
FIGS. 3 and 4 are circuit diagrams of memory cells in different embodiments respectively of the CAM according to the present invention.
Figure 4:
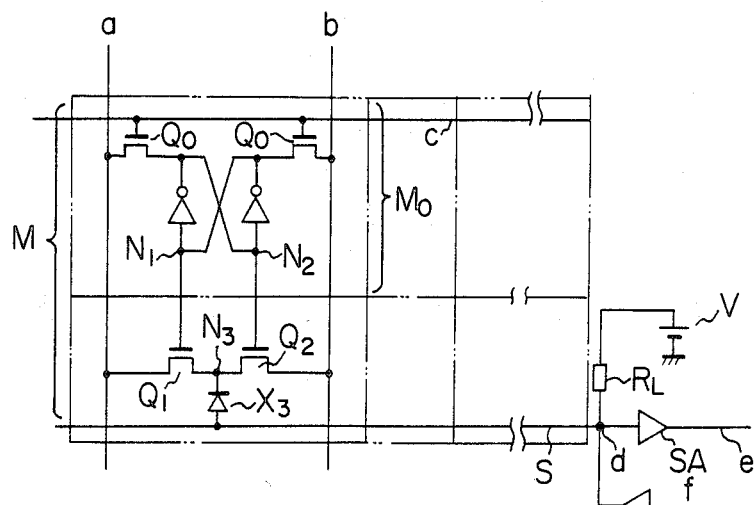

In FIGS. 3 and 4 showing the structure of memory cells in different embodiments respectively of the CAM according to the present invention. The structure of the part $M_0$ surrounded by the dotted lines is the same as the memory cell structure in the conventional static RAM described already, and bit lines a and b are used for writing and reading of data, while a word line c selects the row of the memory cells to be accessed. Also, in each of FIGS. 3 and 4, $Q_1$ and $Q_2$ designate additional switching elements which are illustrated as MOS field effect transistors. However, these switching elements $Q_1$ and $Q_2$ may be bipolar transistors. In any of the above cases, the gate or base used as the control terminal has a high input impedance, so that the conventional RAM operation can be done without any practical difficulty. FIGS. 3 and 4 further include rectifying elements such as diodes $X_1$, $X_2$, $X_3$, a load element $R_L$, sensing amplifier SA, a tri-state driver circuit DRS, a DC power source V, and a sense line S. The symbol CTRL designates the control input terminal of the tri-state driver circuit DRS. When, for example, a low logical level appears at the control input terminal CTRL, the DRS has a high output impedance, while, when a high logical level appears at the CTRL, the potential of the output from the DRS varies depending on the input potential, so that the potential on the sense line S can be set as desired.

How a high-speed associative memory on CAM can be realized according to the present invention will be described with reference to the above structure of FIG. 3 or 4.

For conveniences of description, the field effect transistors $Q_0$, $Q_1$ and $Q_2$ shown in FIGS. 3 and 4 are illustrated to be those of the N-channel type. It will be apparent, however, that those of the P-channel type can similarly operate when the potential polarity is inverted.

A CAM has generally the following two operation modes:

(1) RAM mode: The operation mode in which an address is specified as in the case of a conventional RAM, and a data bit pattern is written in or read out from the memory cells of that word.

(2) CAM mode: The primary associative memory function mode in which a reference data bit pattern is applied, and the coinciding word address information is generated at the output.

Data must be initially stored in the memory cells of the CAM. Therefore, the CAM is initially placed in the RAM mode to be ready for data writing. The bit lines a and b are set at potentials corresponding to a data bit pattern, and the word line c associated with the word to be written is set at a high logical level (H). At this time, the sense line S is set at a low logical level (L) under control by the DRS. Consequently, the sense line S and the bit lines a, b in FIG. 3 are electrically isolated by the diodes $X_1$ and $X_2$, and the one-word writing operation is completed as in the case of a conventional RAM.

Then, when the CAM mode is to be executed, all of the word lines c are set at the level L, and the bit lines a, b and sense lines S are initially set at the level H. For this purpose, the DRS may be actuated or the pull-up action of the loads $R_L$ may be directly utilized. Since the word lines c are now maintained at the level L, the data stored in the memory cells are preserved regardless of the potentials at the bit lines a, b or sense lines S. In the CAM mode, a reference data for comparison purpose is applied as complementary voltage signals to the bit lines a and b of the corresponding bits. This operation is entirely the same as the writing operation in a conventional static RAM and differs only in the point that any one of the word lines c is set at the level L.

Suppose now that the potential levels at the nodal points $N_1$ and $N_2$ are H and L respectively as a result of storage of a data in the memory cell shown in FIG. 3 or 4. Then, the switches $Q_1$ and $Q_2$ are in their on and off states respectively. When a potential L and a potential H are applied to the bit lines a and b respectively (that is, when there is non-coincidence between the stored data and the reference data), current flows through the route of the power source V→load $R_L$→sense line S→common nodal point $N_3$→switch $Q_1$→rectifying element (the diode in this case) $X_1$→bit line a, and the potential at a point d on the sense line S drops due to the voltage drop across the load $R_L$, in the case of the memory cell structure shown in FIG. 3. Also, in the case of the memory cell structure shown in FIG. 4, current flows similarly through the route of the power source V→load $R_L$→point d on the sense line S→diode $X_3$→switch $Q_1$→bit line a to cause a potential drop at the point d. On the contrary, when a potential H and a potential L are applied to the bit lines a and b respectively (that is, when there is coincidence between the stored data and the reference data), the bit line a is electrically isolated from the point d due to the rectifying characteristic of the diode $X_1$ regardless of the fact that the switch $Q_1$ is in its on state. Thus, when coincidence is reached between the stored data and the reference data in all of the memory cells in the memory cell now connected to the same sense line S, the potential at the point d on the sense line S is raised up to the potential level of the power supply by the function of the load element $R_L$. If there is non-coincidence between the stored data and the reference data in any one of the bits, current flows through the above-described route including the switch to cause potential drop at the point d. In this manner, coincidence or non-coincidence between a stored data and a reference data can be discriminated by checking the potential level at the point d on the sense line S.

Figure 5:
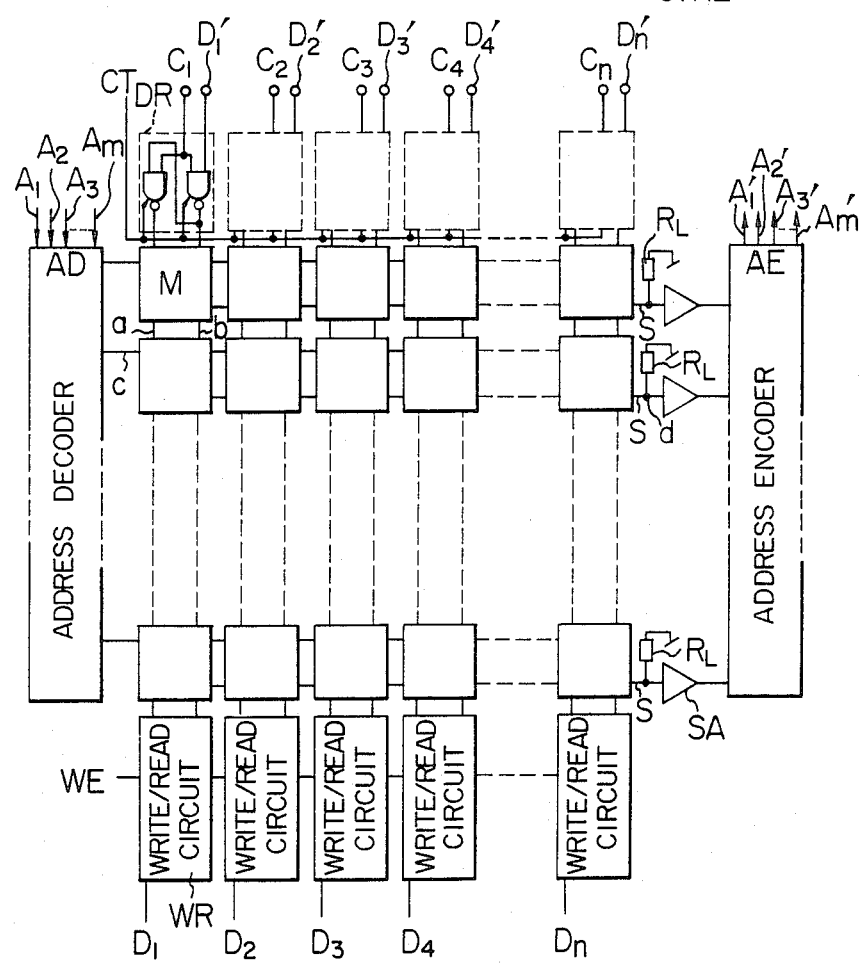
FIG. 5 shows schematically the general structure of the CAM embodying the present invention.

FIG. 5 shows the general structure of an embodiment of the CAM of the present invention comprising the memory cells shown in FIG. 3 or 4. The general structure shown in FIG. 5 includes an address decoder AD, an address encoder AE, a data write/read circuit array WR required for the execution of the usual RAM operation, a drive circuit array DR for applying a reference data input, the memory cells M according to the present invention, load elements $R_L$ and sensing amplifiers SA such as those shown in FIG. 3 or 4, a drive signal line CT, and a write/read signal line WE. The function of the signal lines CT, We and the operation of the CAM will now be described.

(I) Operation as Conventional RAM

The drive signal line CT is set at the level L so as to provide a high output impedance of the driver circuit array DR, that is, to disable the driver circuit array DR. The sense lines S are set at the level L so that the sense lines S are electrically isolated from the bit lines a and b. In response to the application of an address signal by way of the address input lines $A_1$ to $A_m$ to the address decoder AD, the word line c associated with the specified word address is now set at the level H, and the memory cells in that row are selected. In the case of writing, the write/read signal line WE is set at the level H, and complementary potentials according to an input data are applied through the terminals $D_1$ to $D_n$ to the corresponding bit lines a and b to write the data in the memory cells M. In the case of reading, the write/read signal line WE is set at the level L so as to read out the stored data through the terminals $D_1$ to $D_n$.

(II) Operation as CAM

All of the address input lines $A_1$ to $A_m$ are set at the level L. Consequently, all of the word lines c are set at the level L, and none of the memory cell row is selected. The signal line WE is set at the level L to disable the write/read circuit array WR. On the other hand, the sinal line CT is set at the level H to enable the drive circuit DR. When a high potential H is applied to the terminals $C_1$ to $C_n$ of the driver circuit array DR, complementary potentials are applied through the terminals $D_1'$ to $D_n'$ and $D_1'$ to $D_n'$ to the bit lines a and b respectively, and the result of discrimination of coincidence or non-coincidence appears at the output of the sensing amplifier SA of the specific row as described already with reference to FIG. 3 or 4. When, on the other hand, a low potential L is applied to any one of the terminals $C_1$ to $C_n$, both of the bit lines a and b associated with the specific bit column are set at the level H. In such a case, these bit lines a, b are disconnected from the sense lines S regardless of the data stored in the memory cells M. Therefore, the stored data bit associated with the terminal $C_i$ set at the level L among the terminals $C_1$ to $C_n$ is now disregarded, and coincidence between the remaining bits of the stored data and those of the reference data is detected. When a stored data and a reference data are supposed to coincide in one row only at the maximum, the address encoder AE may be a simple binary encoder, and the encoded address signal is generated by way of address output lines $A_1'$ to $A_m'$ from the address encoder AE. On the other hand, when coincidence is supposed to occur in a plurality of rows, the address encoder AE is required to be a complex encoder adapted for encoding addresses according to a predetermined priority order, and all of the coincidence address signals are generated by way of the address output lines $A_1'$ to $A_m'$ of the encoder AE according to the priority order. Although the write/read circuit array WR and the driver circuit array DR are illustrated as separate ones in FIG. 5, they can be incorporated into the same circuit block by merely adding a suitable control circuit.

Figure 6A:
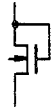
FIGS. 6A to 6C show field effect transistors used as other forms of the rectifying elements used in the embodiments of FIGS. 3 and 4.
Figure 6B:
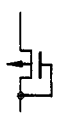
Figure 6C:
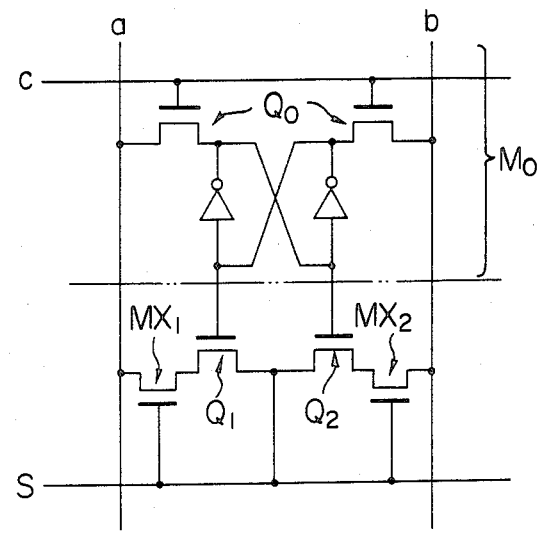
Figure 7A:
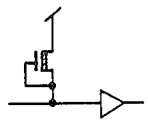
FIGS. 7A and 7B show field effect transistors used as other forms of the load element.
Figure 7B:
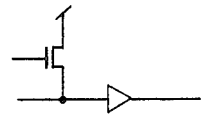

As one form of the rectifying element the diode is illustrated in FIG. 3 or 4 showing the structure of the memory cell according to the present invention. However, in view of the fact that MOS field effect transistors are incorporated almost invariably in a conventional RAM, additional formation of diodes is undesirable in that it leads to an increase of the manufacturing steps. In such a case, an enhancement type field effect transistor having its drain and gate connected in common as shown in FIG. 6A or 6B can be conveniently employed in lieu of the diode so that it functions as the rectifying element. Another usage of enhancement type MOSFET's for the rectifying element is shown in FIG. 6C, where the gates of MOSFET's ($MX_1$, $MX_2$) are connected to the sense line instead of their drains. In N-channel case, for example, the current flows from the bit lines to the sense line is prohibited in the same manner as the previous examples shown in FIG. 6A and FIG. 6B. For similar reasons, it is convenient to employ, in place of the load element $R_L$ which is a simple resistor, a depletion type field effect transistor having its gate and source connected in common as shown in FIG. 7A. Also, when a dynamic load is used to reduce the overall power consumption, a field effect transistor may be connected in a manner as shown in FIG. 7B to replace the load element $R_L$. However, when such a dynamic load is used, it is necessary that a pulse is applied to the gate of the transistor to turn on the transistor and to set the sense line S at the level H immediately before the CAM operation, and, then, the transistor is turned off to start the CAM operation.

Figure 1:
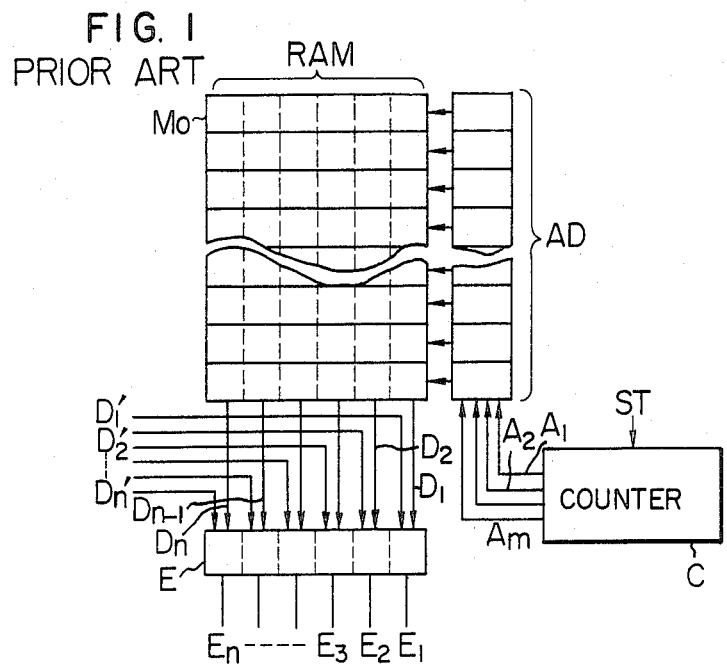
FIG. 1 shows schematically the structure of a prior art associative memory or CAM.
Figure 2A:
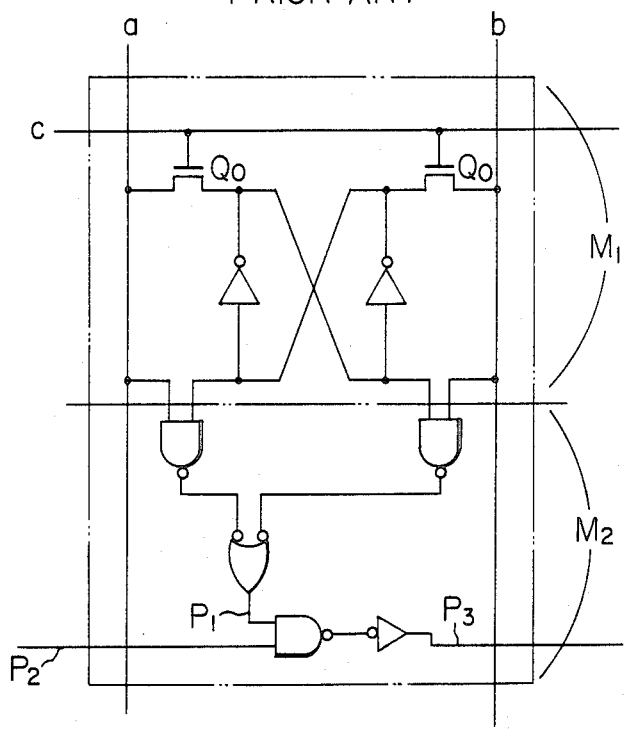
FIG. 2A shows the circuit structure of a prior art CAM cell which has been proposed to attain high-speed operation.
Figure 2B:
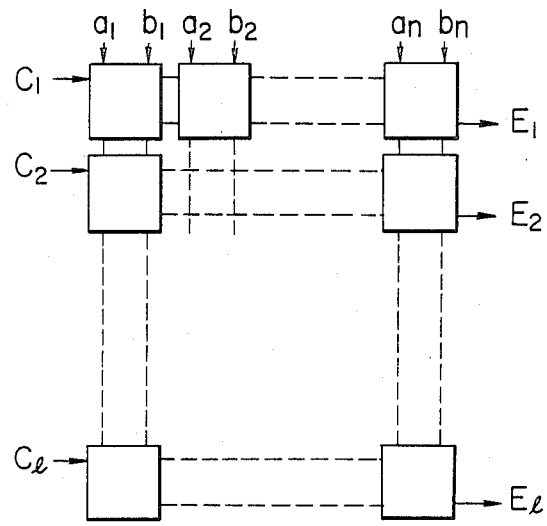
FIG. 2B shows schematically the structure of a memory array composed of the memory cells shown in FIG. 2A.

It will be apparent from the foregoing detailed description of the memory cell and memory array according to the present invention that a CAM operable at a very high speed can be realized by virtue of the fact that detection of coincidence or non-coincidence between a reference data and stored data can be made at once for all of the memory cell rows. Further, elimination of an AND gate detecting coincidence or non-coincidence of data in one word and acting as a source of delay time as shown in FIG. 2A simplifies the circuit of the memory cell and greatly increases the operation speed. For example, when the number of coincidence rows is only one at the maximum, the CAM according to the present invention requires only a length of time of 0.1 $\mu$sec for detecting coincidence or non-coincidence, whereas the prior art CAM has required an excessively large length of time of about 100 $\mu$sec in a worst case.

The reasons why the rectifying elements such as diodes are essentially required in the memory cell according to the present invention will now be clarified.

Figure 8:
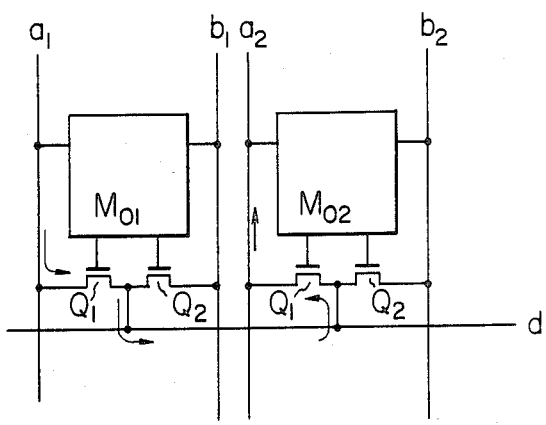
FIG. 8 is a circuit diagram explaining the necessity of provision of the rectifying elements used in FIGS. 3 and 4.

In the first place, if the diodes are absent, the bit lines a, b will not be electrically isolated from the sense line S in the RAM mode as described already, resulting in possibility of mal-operation of the CAM. Secondly, when the CAM operates without the diodes in the CAM mode as shown in FIG. 8 and it is supposed that a "1" and a "0" of a reference data are applied by way of bit lines $a_1$ and $a_2$ respectively, and a "1" and a "1" have been stored in memory cells $M_{01}$ and $M_{02}$ respectively, then, a "0" should primarily appear at the point d on the sense line. However, in the case of the example shown in FIG. 8, current of very large value flows from the bit line $a_1$ into the bit line $a_2$ through a current path as shown by the arrow, and, also, the level at the point d will become intermediate between "0" and "1" resulting in impossibility of execution of the normal CAM operation. The incorporation of the rectifying elements in the memory cell according to the present invention eliminates the current flow from the bit line $a_1$ toward the point d thereby obviating such an abnormal CAM operation.

It will be understood from the foregoing description that the present invention provides a novel and improved CAM capable of high-speed operation without appreciably increasing the number of circuit elements.

What is claimed is:

1. An associative memory comprising memory cells arrayed in columns and rows and each including a bistable circuit having two nodal points having complementary potentials and a pair of first switching elements controlling electrical connections between the nodal points and a pair of bit lines respectively, each of said bit line pairs being disposed for each column of said memory cells, a word line disposed for each row of said memory cells for controlling on-off of said first switching elements depending on its potential, a first series connection of a first rectifying element and a second switching element connected between a sense line and one of said bit lines in each of said memory cells, a second series connection of a second rectifying element and a third switching element connected between said sense line and the other of said bit lines in each of said memory cells, the control terminals of said second and third switching elements being connected to said complementary nodal points respectively in said bistable circuit in each of said memory cells, a sensing amplifier connected to each of said sense lines for sensing the potential thereof, a potential setting circuit connected to each of said sense lines for setting the potential thereof, and a load element connected at one of its terminals to each of said sense lines and at the other terminal to a power source.

2. An associative memory as claimed in claim 1, wherein said rectifying elements in said first and second series connections are replaced by a single rectifying element common to said first and second series connections, and said common element is connected between said sense line and the connection point of said second and third switching elements.

3. An associative memory as claimed in claim 1, wherein an enhancement type field effect transistor is used as each of said first, second and third switching elements, and an enhancement type field effect transistor having its gate and drain connected in common or its gate connected to said sense line is used as each of said rectifying elements.

4. An associative memory as claimed in claim 1, wherein a depletion type field effect transistor having its gate and source connected in common is used as said load element.

5. An associative memory as claimed in claim 1, wherein a dynamic load provided by a field effect transistor having its source connected to said sense line, its drain connected to said power source and its gate connected to a signal source is used as said load element.

* * * * *